United States Patent
Hayes

(10) Patent No.: US 9,979,365 B2
(45) Date of Patent: May 22, 2018

(54) AMPLIFIER DEVICES WITH IN-PACKAGE BIAS MODULATION BUFFER

(71) Applicant: FREESCALE SEMICONDUCTOR INC., Austin, TX (US)

(72) Inventor: Donald V. Hayes, Scottsdale, AZ (US)

(73) Assignee: NXP USA, INC., Austin, TX (US)

(*) Notice: Subject to any disclaimer, the term of this patent is extended or adjusted under 35 U.S.C. 154(b) by 0 days. days.

(21) Appl. No.: 14/972,614

(22) Filed: Dec. 17, 2015

(65) Prior Publication Data

US 2017/0179898 A1 Jun. 22, 2017

(51) Int. Cl.

| | |
|---|---|
| *H03G 3/00* | (2006.01) |
| *H03F 1/02* | (2006.01) |
| *H03F 3/19* | (2006.01) |
| *H03F 3/21* | (2006.01) |
| *H03F 3/213* | (2006.01) |
| *H03F 1/30* | (2006.01) |
| *H03F 3/60* | (2006.01) |
| *H03G 3/30* | (2006.01) |

(52) U.S. Cl.
CPC ........... *H03G 3/007* (2013.01); *H03F 1/0216* (2013.01); *H03F 1/0288* (2013.01); *H03F 3/19* (2013.01); *H03F 3/211* (2013.01); *H03F 3/213* (2013.01); *H03F 1/0261* (2013.01); *H03F 1/302* (2013.01); *H03F 3/602* (2013.01); *H03F 2200/102* (2013.01); *H03F 2200/451* (2013.01); *H03F 2203/21142* (2013.01); *H03G 3/3042* (2013.01)

(58) Field of Classification Search
CPC ............. H03F 1/0222; H03F 2200/102; H03F 1/0261; H03F 1/0288; H03F 1/07; H03F 3/50; H03F 3/602; H03F 3/605; H03F 3/007; H03F 1/0216; H03F 3/19; H03F 3/211; H03F 3/213; H03G 3/20
USPC ......................... 330/136, 285, 286, 296, 297
See application file for complete search history.

(56) References Cited

U.S. PATENT DOCUMENTS

| | | | |
|---|---|---|---|
| 5,315,264 A | 5/1994 | Sundby et al. | |
| 5,325,069 A | 6/1994 | Sundby | |
| 6,731,173 B1 * | 5/2004 | Thompson | ............ H03F 1/0288 330/295 |
| 7,202,735 B2 * | 4/2007 | Ichitsubo | ................... H03F 3/68 330/124 R |
| 7,586,374 B2 * | 9/2009 | Bouny | ................... H03F 1/0288 330/136 |
| 7,756,494 B2 * | 7/2010 | Fujioka | ................. H03F 1/0266 330/296 |
| 8,604,881 B2 | 12/2013 | Sankalp et al. | |
| 8,816,775 B2 * | 8/2014 | Annes | ................... H03F 1/0288 330/285 |

(Continued)

OTHER PUBLICATIONS

Modi, Sankalp S., et al., "Efficiency improvement of Doherty power amplifiers using supply switching and gate bias modulation". Wireless and Microwave Technology Conference (WAMICON), 2014 IEEE 15th Annual. IEEE, 2014.

*Primary Examiner* — Khanh V Nguyen

(57) ABSTRACT

The embodiments described herein include amplifiers that are typically used in radio frequency (RF) applications. The amplifiers described herein use a buffer that is implemented inside the device package. Specifically, the amplifiers can be implemented with a gate bias modulation buffer inside the device package, where the gate bias modulation buffer is configured to provide a modulated bias signal to a transistor gate of the amplifier.

18 Claims, 5 Drawing Sheets

(56) References Cited

U.S. PATENT DOCUMENTS

| | | | |
|---|---|---|---|
| 9,136,809 B2* | 9/2015 | McMorrow | H03F 1/0261 |
| 2015/0145606 A1* | 5/2015 | Lee | H03F 1/0266 330/297 |
| 2015/0288333 A1* | 10/2015 | Lu | H03F 1/0205 330/289 |

* cited by examiner

AMPLIFIER DEVICES WITH IN-PACKAGE BIAS MODULATION BUFFER

TECHNICAL FIELD

Embodiments of the subject matter described herein relate generally to amplifiers, and more particularly to radio frequency (RF) power amplifiers used in a variety of applications.

BACKGROUND

In general, amplifiers are used to increase the power of signals. For example, amplifiers can be used to convert low-power radio frequency (RF) signals into larger RF signals for driving the antenna of a transmitter. In such cases, amplifiers may be implemented as part of an overall power amplifier used by an RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

However, amplifier bandwidth is also an important parameter to consider, and many amplifier designs with high theoretical power efficiencies may have characteristically lower fractional bandwidths, where the fractional bandwidth is the bandwidth of the amplifier divided by the center frequency of the amplifier. Therefore, there remains a need for amplifiers that provide both relatively high efficiency and relatively high fractional bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein can provide semiconductor devices, and particularly amplifiers, with improved performance. For example, the embodiments described herein include amplifiers that are typically used in radio frequency (RF) applications. The amplifiers described herein use a buffer that is implemented inside the device package in a way that facilitates improved amplifier bandwidth. Specifically, the amplifiers can be implemented with a gate bias modulation buffer inside the device package, where the gate bias modulation buffer is configured to provide a modulated bias signal to a transistor gate of the amplifier. So configured, the bias modulation buffer can facilitate an amplifier with a relatively high bandwidth, and specifically a relatively high fractional bandwidth. Furthermore, such an amplifier can be implemented to provide a relatively high capacitive load and relatively high power efficiency.

Figure 1:
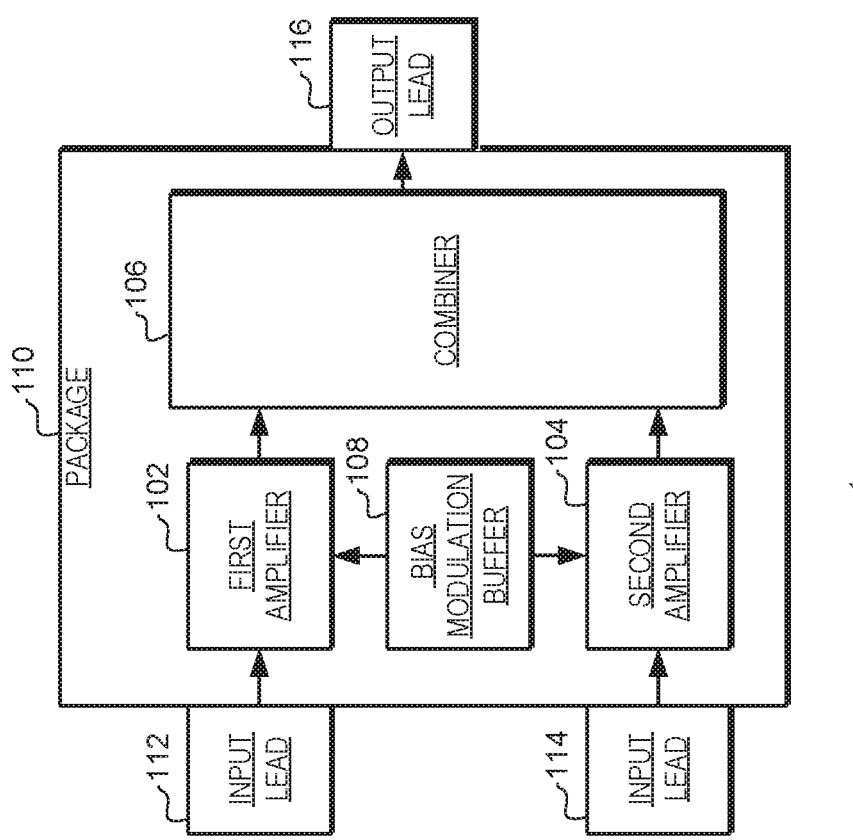
FIG. 1 is a schematic diagram of a portion of an amplifier in accordance with an example embodiment.

Turning now to FIG. 1, a schematic diagram of a portion of an exemplary amplifier 100 is illustrated. The amplifier 100 includes a first amplifier 102 (including one or more first transistors), a second amplifier 104 (including one or more second transistors), a combiner 106, a bias modulation buffer 108, a package 110, input leads 112 and 114, and an output lead 116. It should be noted that amplifier 100 is a simplified representation of a portion of an amplifier, and in a more typical implementation the amplifier 100 would include additional features not illustrated in FIG. 1.

Also, as used herein, the term "package" means a collection of structural components (e.g., including a flange or substrate) to which the primary electrical components (e.g., input and output leads, amplifiers 102, 104, combiner 106, and various electrical interconnections) are coupled, where a "package" is a distinct device that may be coupled to a printed circuit board (PCB) or other substrate that includes other portions of the amplifier.

In accordance with the embodiments described herein, the first amplifier 102 includes a first amplifier output and the second amplifier 104 includes a second amplifier output. The combiner 106 is coupled to the first amplifier output and the second amplifier output and the output lead 116.

In accordance with the embodiments described herein, the bias modulation buffer 108 is implemented inside the package 110. The bias modulation buffer 108 is configured to provide a bias modulation signal to the first amplifier 102 and/or the second amplifier 104. In one embodiment these bias modulation signals are applied to the gate(s) of transistors in the first amplifier 102 and/or second amplifier 104. In general, this bias modulation signal(s) is implemented to track an amplitude of the envelope of an RF signal applied to the first amplifier 102 and/or second amplifier 104. The bias modulation signal(s) may track the amplitude of the envelope of the input RF signal before it is divided (e.g., "RF INPUT," FIG. 2), or it may track the amplitude of the envelope of a portion of the input RF signal after it is divided (e.g., "FIRST SIGNAL" and/or "SECOND SIGNAL," FIG. 2). As one example, the bias modulation signal can be configured to track an amplitude of an envelope signal derived from such an RF signal, where the envelope signal in general approximates a smooth curve outlining the extremes of the RF signal. So configured, the bias modulation signal increases as the amplitude of the envelope of an RF signal increases, and decreases as the amplitude of the envelope of the RF signal decreases.

Such a bias modulation signal, when applied to the amplifier 102 and/or amplifier 104 can keep the transistor(s) in those amplifiers operating at optimal linearity and efficiency during such increases and decreases in the RF signal envelope. Furthermore, in such a configuration the bias modulation buffer 108 can drive the relatively high capacitive load of transistors in the first amplifier 102 and/or second amplifier 104, thus facilitating the tracking of relatively high bandwidth envelope signals, and providing a relatively high fractional bandwidth of the amplifier 100.

In one embodiment, the bias modulation buffer 108 is configured to have an adjustable gain, where the adjustable gain can be selected using a variety of techniques. Adjusting the gain of the bias modulation buffer 108 to a selected value can be used to select the capacitive drive level of the bias modulation signal, which in turn adjusts the bandwidth of the amplifier 100. Specifically, increasing the gain of the bias modulation buffer 108 can increase the bandwidth by increasing the capacitive drive capability effectively reducing the charging time associated with the high capacitive loading of the first and second transistors.

In such embodiments, the gain of the bias modulation buffer 108 can be adjusted using a variety of techniques. For example, in some embodiments a plurality of one-time programmable elements may be provided, such as fuses and anti-fuses. These programmable elements can then be selectively programmed (e.g., blown) to provide the desired gain. As one example, the programmable elements can be blown using a laser or by applying a selection current.

In other embodiments, the bias modulation buffer 108 can be programmed using a programming interface. In such an embodiment, the interface can be implemented as part of, or coupled to, to the bias modulation buffer 108. Such an interface can be coupled through the package 110, such that the gain of the bias modulation buffer 108 can changed after packaging. Such an embodiment can allow the bandwidth of the amplifier 100 to be changed during operation. In such an embodiment, the package 110 may include one or more additional leads (not illustrated) for communicating with the bias modulation buffer 108.

In one specific embodiment, the bias modulation buffer comprises a current conveyer buffer. Such a current conveyer buffer can be implanted with a plurality of selectable stages. By selecting the number of such stages that are being used, the gain of the current conveyer buffer can be adjusted to a desired level. An example of such a current conveyer buffer will be discussed in greater detail below.

In one specific embodiment, the amplifier 100 comprises a portion of a Doherty amplifier. In general, Doherty amplifiers divide an RF signal and use amplifiers of different classes for different parts of the RF signal. Specifically, Doherty amplifiers typically use a carrier amplifier and one or more peaking amplifiers, with the carrier amplifier used to drive the main body of the signal, and the one or more peaking amplifiers used to drive the peaks of the signal. In such an implementation, the carrier amplifier is typically operated as a class AB driver, and the peaking amplifier(s) are configured to operate as class C drivers.

In such an embodiment, the first (carrier) amplifier 102 can comprise one or more transistors (e.g., including a driver transistor and a final stage transistor, or just a final stage transistor), and the second (peaking) amplifier 104 can comprise one or more other transistors (e.g., including a driver transistor and a final stage transistor, or just a final stage transistor). Thus, single stage (e.g., single transistor) carrier and peaking amplifiers can be used in some embodiments, and other embodiments can include multiple-stage amplifiers (e.g., in which each amplification path includes a driver amplifier (transistor) and a final-stage amplifier (transistor) coupled in series).

In a typical Doherty implementation, when the input RF signal is at relatively low signal levels, the first (carrier) amplifier 102 operates near its compression point and thus with high efficiency, while the second (peaking) amplifier(s) 104 are not operating. Thus, at relatively low signal levels the Doherty amplifier can provide both high efficiency and good linearity. Then, when higher signal levels occur, the first (carrier) amplifier 102 compresses, and one or more of the second (peaking) amplifier(s) 104 start to operate and "tops up" the resulting output signal. Thus, the second (peaking) amplifier(s) provide the ability to achieve high power output during times of high input signal levels. Thus, the two drivers of the Doherty amplifier together can provide relatively high power output and high efficiency. Stated another way, Doherty amplifiers thus can combine class AB and class C amplifiers in a way that maintains linearity while providing high power efficiency, and can further provide a high power output.

In the illustrated embodiment, the combiner 106 can be implemented with the transmission line inside the package 110 and between the output lead 116 and the outputs of the carrier amplifier 102 and the one or more peaking amplifiers 104. Examples of such Doherty amplifier implementations will be described in greater detail below. In other embodiments, the combiner 106 may be implemented outside of the package 110.

The combiner 106 is coupled to the outputs of the first transistor 102 and second transistor 104, and combines the signals to an output lead 116. In a typical embodiment, the combiner will include a ¼ wave transformer designed to provide an impedance inverter between the outputs. In general, such an impedance inverter operates to provide an optimal load to the first amplifier 102 and second amplifier 104 during operation.

It should be noted that while the amplifier 100 includes a single bias modulation buffer 108, this is just one example, and in other embodiments additional buffers can be provided. For example, in some embodiments a second peaking amplifier can be included in the package 110. In such an embodiment a second buffer separate from bias modulation buffer 108 can be provided in the package 110, the second buffer having an output coupled to the second peaking amplifier. In this embodiment the second buffer is configured to provide a second bias modulation signal to the second peaking amplifier, where the second bias modulation signal also tracks the amplitude of the envelope signal derived from the second signal.

Figure 2:
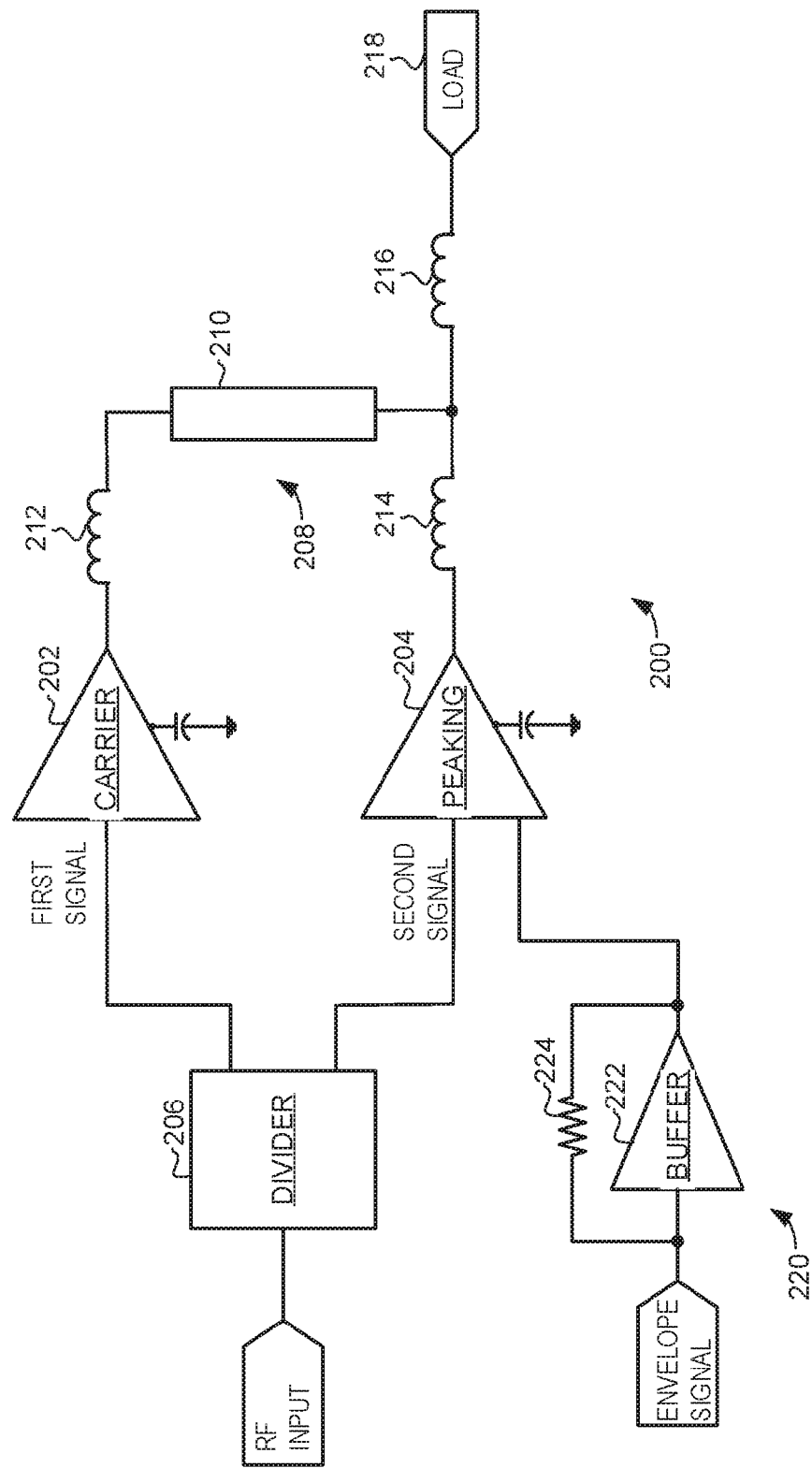
FIG. 2 is a circuit diagram of a portion of an exemplary Doherty amplifier in accordance with an example embodiment.

Turning now to FIG. 2, a circuit diagram representing a portion of an exemplary amplifier 200 is illustrated. In this illustrated embodiment, the amplifier 200 is a Doherty amplifier that receives an RF input signal and drives an amplified signal to a load 218 (e.g., an antenna). The amplifier 200 includes a carrier amplifier 202, a peaking amplifier 204, a divider 206, and a combiner 208.

In general, the divider 206 receives an RF signal and generates two output signals that are 90 degrees out of phase with each other. These two outputs correspond to the first signal and second signal that are applied to the carrier amplifier 202 and peaking amplifier 204 respectively. The two outputs can be in the form of equal-power or unequal-power signals. The 90 degree phase difference can be provided by a phase delay element that applies a phase shift of about 90 degrees to the second signal before outputting the second signal to the peaking amplifier 204. The 90 degree difference in phase allows the output of the peaking amplifier 204 to be in step with the carrier amplifier 202 output when combined by the combiner 208.

The amplifier 200 receives and amplifies the first signal and the phase delayed second signal, combines the amplified first and second signals in phase, and drives the combined signal to a load 218 (e.g., an antenna). The carrier amplifier 202 includes one or more carrier transistors, and the peaking amplifier 204 includes one or more peaking transistors, and the outputs of the carrier and peaking transistors are coupled to combiner 208. Conceptually, the combiner 208 can be considered to include a ¼ wave transformer 210 and inductances 212 and 214. This combiner 208 serves to the combine the outputs of the final (or single) stage carrier amplifier 202 and peaking amplifier 204 such that the combined output can be delivered to the load 218. To facilitate this, the combiner 208 is coupled to the load 218 through inductance 216. The ¼ wave transformer 210 of the combiner 208 provides a 90 degree phase shift to the output of the carrier amplifier 202 and thus facilitates the in-phase combining of that output with the output of the peaking amplifier 204. The combiner 208 also provides an impedance inverter between the outputs of the carrier amplifier 202 and the peaking amplifier 204. During operation, the impedance inverter effectively changes the impedance seen by the carrier amplifier 202 to provide an optimal load to the carrier amplifier 202 at and around the operational frequency. The inductances 212 and 214 in the combiner 208 can be provided by bond wire arrays used to couple the amplifiers 202 and 204 to a combining node (between inductances 214, 216). Likewise, the inductance 216 can be provided by a bond wire array used to couple the combining node to a package lead.

In a typical Doherty implementation, the carrier amplifier 202 is configured to operate as a class AB amplifier, and is used to drive the main body of the output signal. Conversely, the peaking amplifier 204 is configured to operate as a class C amplifier, and is used to the drive the peaks of the output signal. This use of the two amplifiers 202 and 204 as class AB and class C amplifiers with outputs that are combined together can provide both relatively high power output and high efficiency.

In a typical embodiment, the carrier amplifier 202 and peaking amplifier 204 would be implemented with suitable RF-capable transistors with relatively high power capability. For example, the carrier amplifier 202 and peaking amplifier 204 can be implemented with Gallium Nitride (GaN) transistors or laterally diffused metal oxide semiconductor (LD-MOS) transistors. In any event, the "input" of a transistor is a control terminal (e.g., a gate terminal, "G") of the transistor, and the "output" of a transistor is a current carrying terminal (e.g., a drain terminal, "D", or source terminal, "S") of the transistor. In various embodiments, the other current carrying terminal (e.g., the source or drain terminal) is coupled to a ground node of the device (e.g., to the device package substrate or flange).

In accordance with the embodiments described herein, the amplifier 200 includes a bias modulation buffer 220. The bias modulation buffer 220 includes a buffer 222 and a feedback resistor 224. In further accordance with the embodiments described herein, the bias modulation buffer 220 is implemented inside the package (not shown in this FIG.) with the first amplifier 202 and the second amplifier 204. As will be described in greater detail below, co-locating the bias modulation buffer 220 with the carrier amplifier 202 and peaking amplifier 204 inside the package can lead to increased bandwidth.

In this illustrated embodiment, the bias modulation buffer 220 is configured to provide a bias modulation signal to the peaking amplifier 204 (e.g., to the gate of the peaking amplifier 204). In general, this bias modulation signal is implemented to track an amplitude of an RF input signal applied the peaking amplifier 204. To facilitate this, the bias modulation buffer 220 receives an envelope signal. In a typical embodiment, this envelope signal tracks the amplitude of the envelope of the second signal, such that the envelope signal amplitude at least approximates a smooth curve outlining the extremes of the second signal. This envelope signal is amplified or otherwise buffered by the gain bias modulation buffer 220 to generate the bias modulation signal that is applied to the peaking amplifier 204.

Such a bias modulation signal, when applied to the peaking amplifier 204, helps keep the peaking amplifier 204 operating at optimal linearity, and thus can facilitate relatively high efficiency in the amplifier 200. Furthermore, such a configuration can provide a relatively high capacitive load drive capability and relatively high modulation bandwidth in the amplifier 200.

In one embodiment, the bias modulation buffer 220 converts a gain bias modulation signal from a current to a voltage using a current gain buffer and a feedback resistor. In this embodiment, the bias modulation buffer 220 is configured to have an adjustable current gain, where the adjustable current gain can be selected using a variety of techniques. In such an embodiment, adjusting the current gain of the bias modulation buffer 220 results in an adjustment of the bandwidth of the amplifier 200.

In one embodiment, the bias modulation buffer 220 is configured to receive a current as the input, and output a voltage. Specifically, the output of the bias modulation buffer 220 charges capacitances at the output. In one embodiment, the capacitance at the output of the bias modulation buffer 220 comprises primarily the gate capacitance $C_{GATE}$ of the peaking amplifier 204.

In the example of FIG. 2, the bias modulation buffer 220 is configured with the feedback resistor 224 such that the voltage outputted by the bias modulation buffer 220 is substantially equal to the input current times the resistance of the feedback resistor 224. In this embodiment, the rate at which bias modulation buffer 220 charges the gate capacitance $C_{GATE}$ of the peaking amplifier 204 is determined in part by the current gain of the bias modulation buffer 220. Thus, with the bias modulation buffer 220 set at a higher current gain, the gate capacitance $C_{GATE}$ is charged more quickly, and the lower the current gain, the slower the gate capacitance $C_{GATE}$ is charged. This charging of the gate capacitance $C_{GATE}$ continues until it reaches a point where the current flowing back across the feedback resistor 224 is equal to the current provided by the bias modulation buffer 220.

Figure 3:
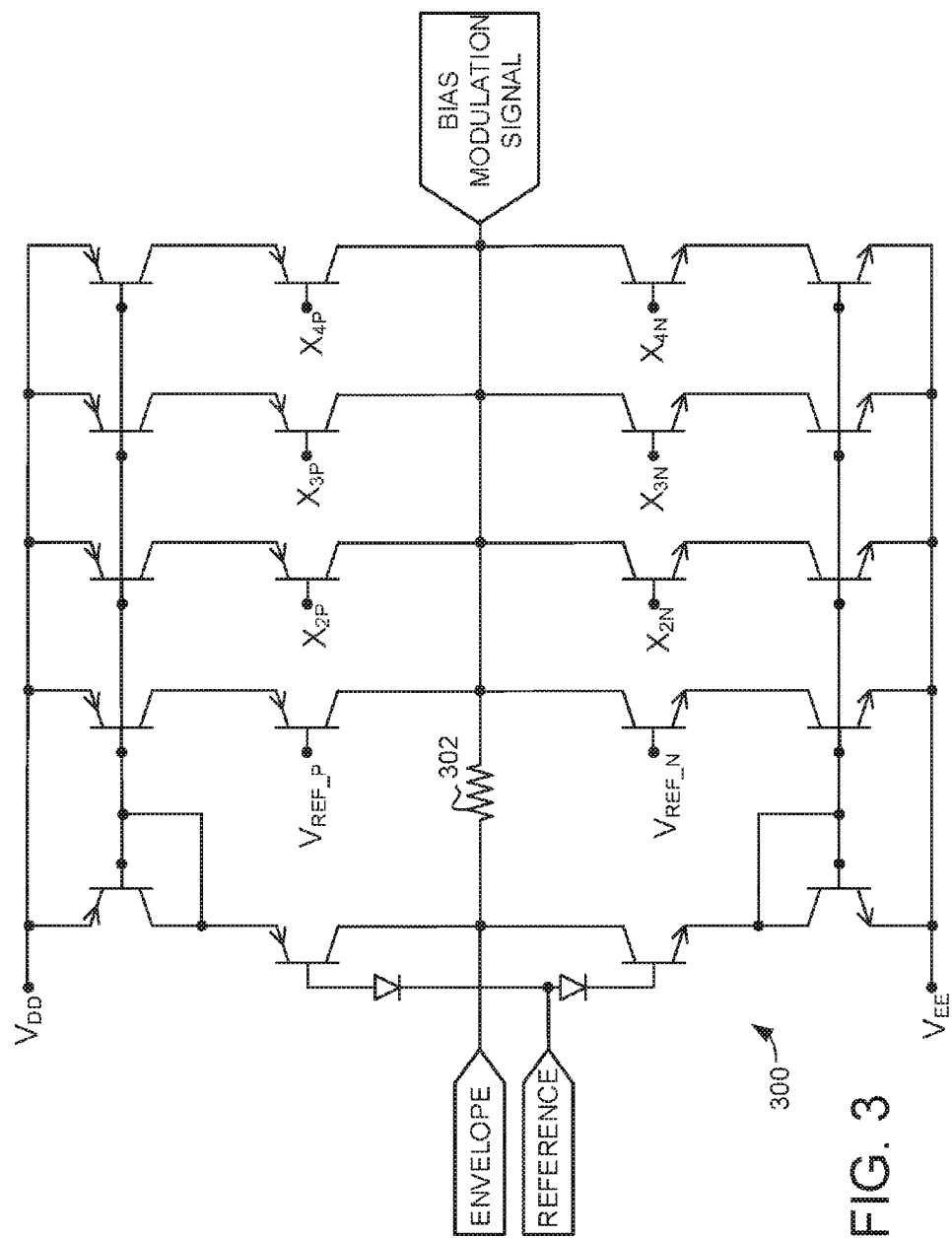
FIG. 3 is a circuit diagram of an exemplary gate bias modulation buffer in accordance with an example embodiment.

Turning now to FIG. 3, a circuit diagram of an exemplary bias modulation buffer 300 is illustrated. The bias modulation buffer 300 is an example of the type of buffer that can be used in the various embodiments described herein. For example, it can be used as the bias modulation buffers illustrated in FIGS. 1 and 2 and 4. In general, the bias modulation buffer 300 illustrated in FIG. 3 is configured to provide a bias modulation signal to a control terminal (e.g., a gate) of a transistor in an amplifier, where the bias modulation signal is implemented to track an amplitude of an envelope of an RF input signal.

To facilitate this, the bias modulation buffer 300 receives an envelope signal, a reference signal, and various control inputs. In a typical embodiment, the envelope signal tracks the amplitude of the envelope of the signal being applied to the amplifier, such that the envelope signal amplitude at least approximates a smooth curve outlining the extremes of this signal. In one embodiment, this envelope signal is derived from the RF input signal, using any suitable technique. This envelope signal is amplified by the gain bias modulation buffer 300 to generate the bias modulation signal. The reference signal is used to set the input voltage at the envelope input. The various control inputs $V_{REF\_P}$, $V_{REF-N}$, $X_{2P}$, $X_{2N}$, $X_{3P}$, $X_{3N}$, $X_{4P}$, and $X_{4N}$ are used to control the gain of the bias modulation buffer 300.

In this illustrated embodiment, the bias modulation buffer 300 comprises a current conveyer buffer that incorporates a feedback resistor 302. As such, the bias modulation buffer 300 includes a plurality of individually selectable stages. Specifically, in this illustrated embodiment the bias modulation buffer 300 includes four stages, with each of these four stages including a set of four transistors arranged in series. In other embodiments, more or fewer than four stages may be implemented. Furthermore, two of those transistors in each stage are coupled to selector inputs that are used to select the number of stages that are active, and thus select the current gain of the bias modulation buffer 300.

Specifically, the $V_{REF\_P}$ and $V_{REF-N}$ are the inputs that are applied to two transistors in the first stage. During operation at least one stage is always active, so these inputs would typically be asserted during any operation of the associated amplifier. Stated another way, the current flowing through those transistors will represent the minimum gain that can be provided by the bias modulation buffer 300, when this stage is the only active stage.

Specifically, the assertion of the $V_{REF\_P}$ and $V_{REF-N}$ inputs causes current to flow through the four transistors in that stage. This current charges the capacitive load at the output, and when that capacitive load is fully charged an equal amount of current will be flowing back through the feedback resistor 302.

Likewise, the $X_{2P}$ and $X_{2N}$ inputs are applied to the second stage, and thus can be used to selectively turn on or turn off the second stage. Likewise, the $X_{3P}$ and $X_{3N}$ inputs are applied to the third stage, and thus can be used to selectively turn on or turn off the third stage. Finally, the $X_{4P}$ and $X_{4N}$ inputs are applied to the fourth stage, and thus can be used to selectively turn on or turn off the fourth stage.

It should be noted that in each of these cases the asserting the associated inputs turns on the associated transistors in the stage, and results in mirrored current flowing through the associated stage. Stated another way, when each stage is turned on using the associated inputs, the current flowing in the first stage is mirrored in the other turned on stages. This resulting current mirror causes an increase in total current through the bias modulation buffer 300, and the increases the open loop current gain of the gain bias modulation buffer 300.

Thus, the bias modulation buffer 300 can be configured to have 1, 2, 3 or 4 stages operating, and can thus have four associated levels of adjustable current gain. By selecting the number of such stages that are being used, the gain of the current conveyer buffer can be adjusted to a desired level.

Stated another way, the bias modulation buffer 300 is configured with the feedback resistor 302 such that the voltage outputted as the bias modulation signal is substantially equal to the input current times the resistance of the feedback resistor 302. In this embodiment, the rate at which bias modulation buffer 300 charges a capacitance at its output (e.g., the gate capacitance of a transistor in the peaking amplifier) is determined in part by the number of stages that are currently active. Thus, with the bias modulation buffer 300 set to have more stages on, the capacitance at the output is charged more quickly, and the gain is higher. Conversely, with less stages on, the slower the capacitance is charged and thus the lower the gain that is provided.

A variety of techniques can be used to select the gain of the bias modulation buffer 300. For example, in some embodiments a plurality of one-time programmable elements may be provided, such as fuses and anti-fuses. These programmable elements can then be selectively programmed (e.g., blown) to set the control inputs and select how many stages of the bias modulation buffer 300 are active, and thus select the gain.

In other embodiments, the bias modulation buffer 300 can be controlled using a programming interface. In such an embodiment, the interface can be used to program or otherwise control the gain of bias modulation buffer 300. Such an embodiment can allow the gain of the bias modulation buffer 300 to be changed during operation, and thus can provide increased flexibility.

Again, it should be noted that the bias modulation buffer 300 is just one example of the type of buffer that can implemented in a package and used in the various embodiments.

Figure 4:
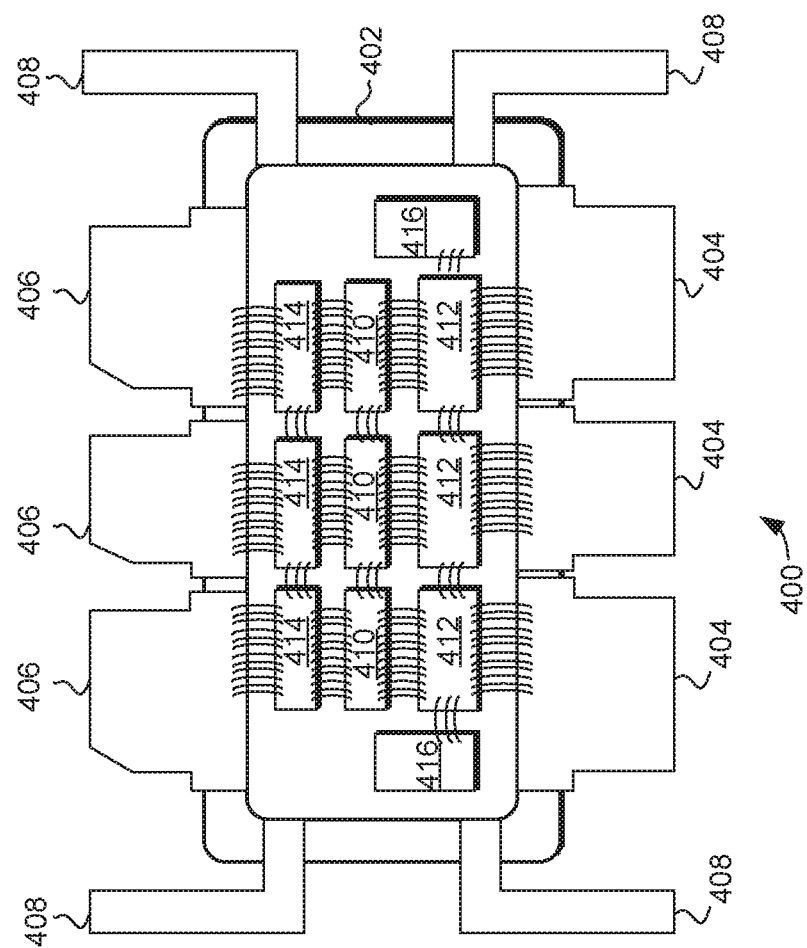
FIG. 4 is a schematic diagram of an exemplary packaged device that includes a portion of an amplifier in accordance with an example embodiment.

Turning now to FIG. 4, a top view of a portion of an exemplary amplifier 400 that is implemented within a single package is illustrated. The amplifier 400 includes a package 402, an input lead 404, an output lead 406, biasing leads 408, and bond wire arrays 420. The package 402 includes a package substrate (e.g., formed of PCB materials with various conductive features) or a flange (e.g., a rigid conductive component) to which semiconductor devices are mounted. The package substrate or flange may provide an electrical ground reference for the semiconductor devices. The package 402 also may include an isolator that electrically isolates the package substrate or flange from the leads 404, 406 and 408, or alternatively may include encapsulation that provides such electrical isolation. The package 402 may be an air-cavity package or an overmolded (encapsulated) package, in various embodiments.

In this illustrated embodiment, a plurality of semiconductor devices are mounted to the package substrate, where these semiconductor devices include input matching network components 412, transistors 410, output matching network components 414, and bias modulation buffers 416.

In one embodiment, the transistors 410 can include a carrier transistor and one or more peaking transistors, with each transistor formed on a corresponding semiconductor die. Likewise, the input matching network components 412, output matching network components 414 and bias modulation buffers 416 are each formed on corresponding semiconductor die. In the illustrated embodiment, the transistors 410 include a carrier transistor 410 and two peaking transistors 410, although more or fewer peaking transistors could be implemented in other embodiments. It should be noted that the amplifier 400 illustrated in FIG. 4 is a simplified representation of such an amplifier, and thus in many typical implementations amplifiers would include additional features not illustrated in FIG. 4.

In this implementation the input leads 404 each are configured to receive an RF signal (e.g., from a signal divider that is implemented on a PCB to which the package 402 is coupled), and bond wire arrays 420 couple the input leads 404 to the input matching networks components 412. Likewise, various bond wire arrays 420 connect the elements inside the package, and connect the output matching network components 414 to the output leads 406.

In this implementation the input leads 404 each are configured to receive an RF signal (e.g., from a divider). The bond wire arrays 420 between the input leads 404 and components 412 (e.g., capacitors), components 412, and the bond wire arrays 420 between components 412 and transistors 410 form portions of the input matching network coupled between the input lead 404 and the inputs (e.g., gates) of the transistors 410. Similarly, the output leads 406 each are configured to output an RF signal (e.g., to a combiner implemented on a PCB to which the package 402 is coupled). The bond wire arrays 420 between the transistors 410 and components 414 (e.g., capacitors), components 414, and the bond wire arrays 420 between components 414 and the output leads 406 form portions of the output matching network coupled between the output (e.g., drain) of the transistor and the output leads 406.

It should be noted that the number and arrangement of bond wires would be selected based on the power handling requirements and the desired inductances of the bond wires. Thus, for connections that require more power handling ability more bond wires can be provided. Further, although the transistors 410 are illustrated on three separate die, an alternate embodiment may have the transistors 410 implemented on a single die.

In accordance with the embodiments described herein, the bias modulation buffers 416 are configured to provide bias modulation signals to the transistors 410. For example, the gate bias modulation buffers 416 can provide the bias modulation signals to the gates of peaking transistors in a Doherty amplifier. Again, such bias modulation buffers 416 can be configured to have an adjustable gain, where the adjustable gain can be selected using a variety of techniques. For example, one or more of the leads 408 can be configured for use in selecting the adjustable gain of the bias modulation buffers 416, and thus can facilitate adjustment of the bandwidth of the amplifier 400.

In the illustrated embodiment, the bias modulation buffers 416 are coupled with wirebonds to components 412, and further wirebonds 420 are coupled between components 412 and the control terminals (e.g., gates) of transistors 410. In this manner, the bias modulation buffers 416 are coupled to the transistors 410 in order to convey the output signal from the bias modulation buffers 416 to the control terminals of the transistors 410. In other embodiments, the bias modulation buffers 416 may include wirebonds that are directly coupled to the control terminals of transistors 410 in order to convey the output signals from the bias modulation buffers 416 to the transistors 410.

Further, in the illustrated embodiments, the bias modulation buffers 416 are coupled to the outer transistors 410 (e.g., the outer transistors 410 correspond to the peaking amplifier transistors, and the center transistor 410 corresponds to the carrier amplifier transistor). In other embodiments, the carrier amplifier transistor and the peaking amplifier transistor(s), and thus the bias modulation buffer(s) 416 may be differently arranged within the package 402.

In further accordance with the embodiments described herein, the bias modulation buffers 416 are implemented inside the package 402, with the transistors 410 and other associated elements. Co-locating the bias modulation buffers 416 with the transistors 410 can provide the amplifier 400 with an increased operational bandwidth. Specifically, the use of the bias modulation buffers 416 can provide increased bandwidth in the amplifier 200 by providing appropriate bias modulation signals that improve the operation of the transistors 410. Furthermore, co-locating the bias modulation buffers 416 with the transistors 410 reduces the inductances between the bias modulation buffers 416 and the load driven by the bias modulation buffers 416. Specifically, because the bias modulation buffers 416 can be coupled using bond wire arrays 420 inside the package 402 or other suitable in package connections, the amount of inductance can be minimized. This minimization in inductance can improve the stability of the bias modulation buffers 416 and further increase the operational bandwidth of the gate bias modulation.

Figure 5:
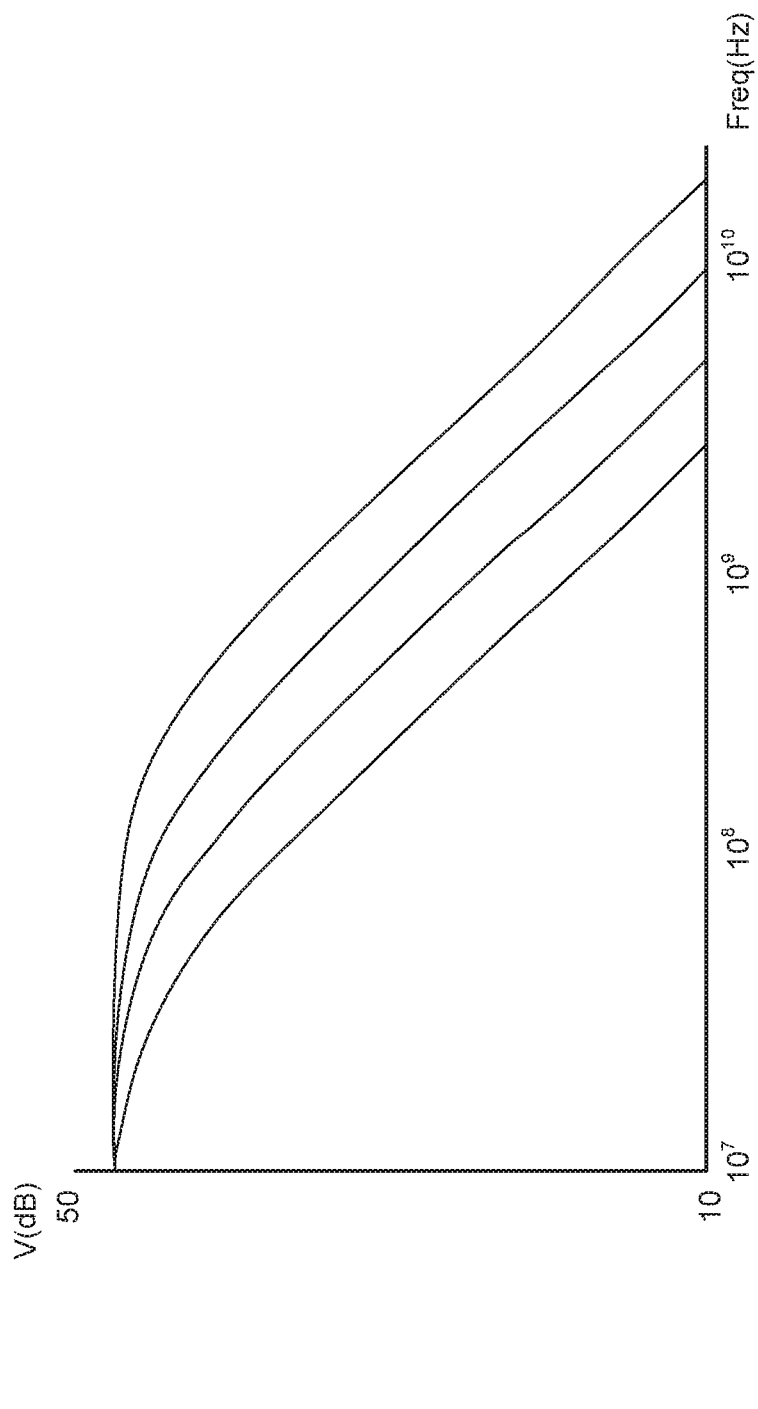
FIG. 5 is a graphical representation of amplifier bandwidth in accordance with an example embodiment.

Turning now to FIG. 5, a graphical representation 500 of four exemplary amplifier bandwidths is illustrated. Specifically, FIG. 5 illustrates the bandwidth associated with gate capacitance of 100 pF, a feedback resistor of 250 ohms, and a gain bias modulation amplifier that uses a current conveyer to provide current gains of 10, 20, 40 and 80. As can be seen in FIG. 5, the higher the gain, the greater the associated bandwidth of the associated amplifier.

The embodiments described herein can thus provide semiconductor devices, and particularly amplifiers, with improved performance. Specifically, the amplifiers described herein use a buffer that is implemented inside the device package in a way that facilitates improved amplifier bandwidth. So configured, the bias modulation buffer can facilitate an amplifier with a relatively high fractional bandwidth. Furthermore, such an amplifier can be implemented to provide a relatively high capacitive load and relatively high power efficiency.

Various modifications may be made to the above-described and illustrated embodiments without departing from the scope of the inventive subject matter. For example, although conventional Doherty amplifier implementations are discussed above (e.g., in which a 90 degree phase delay is applied to the input peaking signal prior to amplification, and a corresponding 90 degree phase delay is applied to the output carrier signal after amplification to ensure that the amplified carrier and peaking signals are combined in phase), other embodiments may include an "inverted" Doherty amplifier implementation (e.g., in which a 90 degree phase delay is applied to the input carrier signal prior to amplification, and a corresponding 90 degree phase delay is applied to the output peaking signal after amplification). Further, as mentioned above, embodiments include single-stage and multiple-stage amplifiers. Also, the main and peaking transistors may be implemented on separate die or on the same die, in various embodiments.

In one embodiment, an amplifier is provided, the amplifier comprising: a device package including at least one output lead and at least one input lead, the device package encasing: a first amplifier, the first amplifier configured to receive a first radio frequency (RF) signal; a second amplifier, the second amplifier configured to receive a second radio frequency (RF) signal, the second RF signal having an amplitude; and a buffer, the buffer having an output coupled to the second amplifier, the buffer configured to provide a bias modulation signal to the second amplifier.

In another embodiment, a Doherty amplifier is provided, the Doherty amplifier comprising: device package including an output lead and at least one input lead, the device package encasing: a carrier amplifier, the carrier amplifier including a carrier amplifier output, the carrier amplifier configured to receive a first radio frequency (RF) signal; a peaking amplifier, the peaking amplifier including a peaking amplifier output, the peaking amplifier configured to receive a second RF signal, the second RF signal having an amplitude; a combiner, the combiner coupled to the carrier amplifier output and the peaking amplifier output, the combiner further coupled to the output lead; and a buffer, the buffer having an output coupled to the peaking amplifier, the buffer configured to provide a bias modulation signal to the peaking amplifier, where the bias modulation signal tracks an amplitude of an envelope signal.

In another embodiment, a Doherty amplifier is provided, the Doherty amplifier comprising: a device package including an output lead and at least one input lead, the device package encasing: a carrier amplifier, the carrier amplifier including a carrier amplifier output, the carrier amplifier configured to receive a first radio frequency (RF) signal; a peaking amplifier, the peaking amplifier including a peaking transistor gate and a peaking amplifier output, the peaking amplifier configured to receive a second RF signal, where the second RF signal is 90 degrees phase shifted relative to the first RF signal; a combiner, the combiner coupled to the carrier amplifier output and the peaking transistor amplifier, the combiner further coupled to the output lead; and a programmable buffer, the programmable buffer configured to receive an envelope signal derived from the second RF signal and output a bias modulation signal, the bias modulation signal applied to the peaking transistor gate, and wherein the programmable buffer comprises a current conveyer with a plurality of stages, and wherein the plurality of stages are selectable to provide an adjustable current gain on the bias modulation signal.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Furthermore the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
   a device package including at least one output lead and at least one input lead, the device package encasing:
      a first amplifier, the first amplifier configured to receive a first radio frequency (RF) signal;
      a second amplifier, the second amplifier configured to receive a second radio frequency (RF) signal, the second RF signal having an amplitude; and
      a buffer, the buffer having an output coupled to the second amplifier, the buffer configured to provide a bias modulation signal to the second amplifier, wherein the bias modulation signal tracks an amplitude of an envelope signal derived from the second RF signal.

2. The amplifier of claim 1, wherein the buffer has a selectable gain.

3. The amplifier of claim 1, wherein the buffer comprises a current conveyer buffer.

4. The amplifier of claim 1, wherein the buffer comprises a current conveyer buffer, the current conveyer buffer having a plurality of selectable stages, and wherein the plurality of selectable stages provides an adjustable gain.

5. The amplifier of claim 1, wherein the buffer has a gain, and further comprising an interface, the interface coupled to the buffer to facilitate adjustment of the gain by programming.

6. The amplifier of claim 5, wherein the device package has at least one additional lead, and wherein the interface is electrically coupled to the at least one additional lead to facilitate the programming.

7. The amplifier of claim 1, wherein the buffer has a gain, and wherein the gain is programmable through one time programmable elements.

8. The amplifier of claim 1, wherein the amplifier comprises a Doherty amplifier, and wherein the first amplifier is implemented as a carrier amplifier, and wherein the second amplifier is implemented as a peaking amplifier.

9. A Doherty amplifier comprising:
   a device package including an output lead and at least one input lead, the device package encasing:
      a carrier amplifier, the carrier amplifier including a carrier amplifier output, the carrier amplifier configured to receive a first radio frequency (RF) signal;
      a peaking amplifier, the peaking amplifier including a peaking amplifier output, the peaking amplifier configured to receive a second RF signal, the second RF signal having an amplitude;
      a combiner, the combiner coupled to the carrier amplifier output and the peaking amplifier output, the combiner further coupled to the output lead; and
      a buffer, the buffer having an output coupled to the peaking amplifier, the buffer configured to provide a bias modulation signal to the peaking amplifier, wherein the buffer has a selectable gain.

10. The Doherty amplifier of claim 9, wherein the buffer comprises a current conveyer buffer, the current conveyer buffer having a plurality of selectable stages, and wherein the plurality of selectable stages provides the selectable gain.

11. The Doherty amplifier of claim 9, further comprising a programming interface, the programming interface coupled to the buffer to facilitate adjustment of the selectable gain by programming.

12. The Doherty amplifier of claim 11, wherein the device package has a lead, and wherein the programming interface is electrically coupled to the lead to facilitate the programming.

13. The Doherty amplifier of claim 9, wherein the selectable gain is programmable through one time programmable elements.

14. The Doherty amplifier of claim 9, further comprising:
a second peaking amplifier in the device package, the second the peaking amplifier including a second peaking amplifier output, the second peaking amplifier configured to receive a third RF signal;
a second buffer in the device package, the second buffer having an output coupled to the second peaking amplifier, the second buffer configured to provide a second bias modulation signal to the second peaking amplifier; and
where the first bias modulation signal tracks an amplitude of a first envelop signal and where the second bias modulation signal tracks an amplitude of a second envelope signal.

15. A Doherty amplifier comprising:
a device package including an output lead and at least one input lead, the device package encasing:
a carrier amplifier, the carrier amplifier including a carrier amplifier output, the carrier amplifier configured to receive a first radio frequency (RF) signal;
a peaking amplifier, the peaking amplifier including a peaking transistor gate and a peaking amplifier output, the peaking amplifier configured to receive a second RF signal, where the second RF signal is 90 degrees phase shifted relative to the first RF signal;
a combiner, the combiner coupled to the carrier amplifier output and the peaking transistor amplifier, the combiner further coupled to the output lead; and
a programmable buffer, the programmable buffer configured to receive an envelope signal derived from the second RF signal and output a bias modulation signal, the bias modulation signal applied to the peaking transistor gate, and wherein the programmable buffer comprises a current conveyer with a plurality of stages, and wherein the plurality of stages are selectable to provide an adjustable current gain on the bias modulation signal.

16. The Doherty amplifier of claim 15, further comprising interface, the interface coupled to the buffer to facilitate adjustment of the gain by programming.

17. The Doherty amplifier of claim 15, wherein the gain is programmable using one time programmable elements.

18. The Doherty amplifier of claim 15, further comprising:
a second peaking amplifier in the device package, second the peaking amplifier including a second peaking amplifier output and a second peaking transistor gate, the second peaking amplifier configured to receive a third RF signal; and
a second programmable buffer in the device package, the second programmable buffer configured to receive a second envelope signal derived from the third RF signal and output a second bias modulation signal, the second bias modulation signal applied to the second peaking transistor gate, and wherein the second programmable buffer comprises a second current conveyer with a second plurality of stages, and wherein the second plurality of stages are selectable to provide a second adjustable current gain on the bias modulation signal.

* * * * *